US012356835B2

(12) United States Patent
Wang et al.

(10) Patent No.: US 12,356,835 B2
(45) Date of Patent: Jul. 8, 2025

(54) DISPLAY PANEL WITH A THROUGH HOLE AND DISPLAY REGIONS HAVING DIFFERENT DISTRIBUTION DENSITIES OF SPACERS, AND DISPLAY APPARATUS

(71) Applicants: Chengdu BOE Optoelectronics Technology Co., Ltd., Sichuan Province (CN); BOE Technology Group Co., Ltd., Beijing (CN)

(72) Inventors: Ge Wang, Beijing (CN); Zhiliang Jiang, Beijing (CN); Xiaomin Yuan, Beijing (CN); Qingqing Yan, Beijing (CN); Qing He, Beijing (CN)

(73) Assignees: Chengdu BOE Optoelectronics Technology Co., Ltd., Sichuan Province (CN); BOE Technology Group Co., Ltd., Beijing (CN)

( * ) Notice: Subject to any disclaimer, the term of this patent is extended or adjusted under 35 U.S.C. 154(b) by 509 days.

(21) Appl. No.: 17/755,328

(22) PCT Filed: Mar. 5, 2021

(86) PCT No.: PCT/CN2021/079372
§ 371 (c)(1),
(2) Date: Apr. 27, 2022

(87) PCT Pub. No.: WO2022/183501
PCT Pub. Date: Sep. 9, 2022

(65) Prior Publication Data
US 2023/0165113 A1    May 25, 2023

(51) Int. Cl.
*H10K 59/80*    (2023.01)
*H10K 59/122*   (2023.01)
*H10K 59/35*    (2023.01)

(52) U.S. Cl.
CPC ....... *H10K 59/8723* (2023.02); *H10K 59/122* (2023.02); *H10K 59/352* (2023.02); *H10K 59/353* (2023.02); *H10K 59/873* (2023.02)

(58) Field of Classification Search
CPC ............. H10K 59/873; H10K 50/8445; H10K 59/8731; H10K 50/8428; H10K 50/844;
(Continued)

(56) References Cited

U.S. PATENT DOCUMENTS

2016/0254476 A1*  9/2016  Park ............... H10K 50/813
                                                         257/40
2019/0140030 A1*  5/2019  Huangfu .......... H10K 59/122
(Continued)

FOREIGN PATENT DOCUMENTS

CN    109037475 A    12/2018
CN    109638173 A     4/2019
(Continued)

*Primary Examiner* — Younes Boulghassoul
(74) *Attorney, Agent, or Firm* — Workman Nydegger

(57) ABSTRACT

A display panel and a display apparatus. The display panel includes: a base substrate with a display region including a first display region, and the display region has a first frame and a second frame opposite to each other, a through hole, penetrating through the base substrate, wherein a distance between a center of the through hole and the first frame is smaller than a distance between the center of the through hole and the second frame; and a plurality of spacers, located on a side of the base substrate, wherein the first display region includes a region between the through hole and the first frame, and a distribution density of the spacers in the first display region is larger than a distribution density of the spacers between the through hole and the second frame.

19 Claims, 16 Drawing Sheets

(58) Field of Classification Search
CPC .. H10K 71/135; H10K 71/12; H10K 59/8723; H10K 59/122; H10K 59/124; H10K 59/173; H10K 59/352; H10K 59/353
See application file for complete search history.

(56) References Cited

U.S. PATENT DOCUMENTS

| | | |
|---|---|---|
| 2019/0333973 A1 | 10/2019 | Yuan et al. |
| 2020/0035944 A1* | 1/2020 | Wang ................. H10K 50/8426 |
| 2020/0212125 A1* | 7/2020 | Liu ..................... H10K 59/352 |
| 2021/0005840 A1 | 1/2021 | Lu et al. |
| 2021/0066642 A1* | 3/2021 | Lee ..................... H10K 59/124 |
| 2021/0151715 A1* | 5/2021 | Lee ........................ H10K 77/10 |
| 2022/0115454 A1* | 4/2022 | Ko ........................... H10K 71/00 |
| 2022/0190073 A1* | 6/2022 | Song ................. H10K 50/8428 |
| 2022/0293700 A1 | 9/2022 | Zhang et al. |
| 2022/0334424 A1* | 10/2022 | Chen ................ G02F 1/133514 |

FOREIGN PATENT DOCUMENTS

| | | |
|---|---|---|
| CN | 110323261 A | 10/2019 |
| CN | 110379844 A | 10/2019 |
| CN | 110379933 A | 10/2019 |
| CN | 110718640 A | 1/2020 |
| CN | 111525044 A | 8/2020 |
| CN | 112385057 A | 2/2021 |
| JP | 2008-243649 A | 10/2008 |

* cited by examiner

DISPLAY PANEL WITH A THROUGH HOLE AND DISPLAY REGIONS HAVING DIFFERENT DISTRIBUTION DENSITIES OF SPACERS, AND DISPLAY APPARATUS

The present application is a National Stage of International Application No. PCT/CN2021/079372, filed on Mar. 5, 2021, the entire contents of which are incorporated herein by reference.

FIELD

The present disclosure relates to the field of semiconductors, in particular to a display panel and a display apparatus.

BACKGROUND

At present, terminal consumers have higher and higher requirements on screen-to-body ratio of a display screen, which brings new demands and challenges to the design and manufacture of display screens. Hole-digging screens have become current mainstream full-screen solutions due to their high screen-to-body ratio, convenience in use, and good reliability. With the development of technology, a touch control film layer needs to be integrated into the display screen.

SUMMARY

An embodiment of the present disclosure provides a display panel, including: a base substrate, provided with a display region, wherein the display region is provided with a first display region, and the display region is provided with a first frame and a second frame opposite to each other, a third frame connecting one end of the first frame and one end of the second frame, and a fourth frame connecting the other end of the first frame and the other end of the second frame: a through hole, penetrating through the base substrate, wherein a distance between a center of the through hole and the first frame is smaller than a distance between the center of the through hole and the second frame; and a plurality of spacers on a side of the base substrate, wherein the first display region includes a region between the through hole and the first frame, and a distribution density of spacers in the first display region is larger than a distribution density of spacers between the through hole and the second frame.

In one possible implementation, a distance between the center of the through hole and the third frame is substantially equal to a distance between the center of the through hole and the fourth frame.

In one possible implementation, a distance between the center of the through hole and the third frame is smaller than a distance between the center of the through hole and the fourth frame, and the first display region further includes a region between the through hole and the third frame.

In one possible implementation, the display region further includes a corner part, the first frame is connected with the third frame through the corner part, and the first display region further includes a region between the through hole and the corner part.

In one possible implementation, the display region further includes a second display region and a third display region, and the third display region is on at least one side of the second display region away from the through hole. A distribution density of spacers in the second display region is larger than a distribution density of spacers in the third display region, and the distribution density of the spacers in the first display region is larger than the distribution density of the spacers in the second display region.

In one possible implementation, the display region has a plurality of sub-pixels, and in the first display region, spacers are in sub-pixel rows and are in a gap between every two adjacent sub-pixels in each of the sub-pixel rows.

In one possible implementation, in the first display region, the spacers in every two adjacent sub-pixel rows are distributed in a misalignment mode.

In one possible implementation, in the first display region, spacers are further in a gap between every two adjacent sub-pixel rows.

In one possible implementation, in the display region except the first display region, spacers are in a gap between every two adjacent sub-pixel rows.

In one possible implementation, in the second display region, spacers are in the sub-pixel rows and are in the gap between every two adjacent sub-pixels, and in the third display region, the spacers are in a gap between every two adjacent sub-pixel rows.

In one possible implementation, each of the sub-pixel rows includes a plurality of sub-pixels, the sub-pixels of the sub-pixel row include a first sub-pixel, a second sub-pixel and a third sub-pixel arranged sequentially in cycles, the first sub-pixels and the third sub-pixels are hexagonal in shape, a width of the first sub-pixel is smaller than a width of the third sub-pixel in a direction parallel to an extending direction of the sub-pixel row, the second sub-pixel includes two pentagonal patterns opposite to each other, and a third sub-pixel of one sub-pixel row in two adjacent sub-pixel rows is corresponding to a gap between a first sub-pixel and a second sub-pixel of other sub-pixel row in the two adjacent sub-pixel rows. The spacers between the two adjacent sub-pixel rows are in gaps between the first sub-pixels of the other sub-pixel row and the third sub-pixels of the one sub-pixel row.

In one possible implementation, an extending line of a long axis of each spacer between adjacent sub-pixel rows intersects with an extending line of a long axis of each spacer in the sub-pixel rows.

In one possible implementation, the third sub-pixel is provided with a first side edge and a second side edge which are perpendicular to the extending direction of the sub-pixel row, a third side edge and a fourth side edge which are respectively connected to two ends of the first side edge, and a fifth side edge and a sixth side edge which are respectively connected to two ends of the second side edge, wherein the second side edge is on a side of the first side edge away from the second sub-pixel adjacent to the third sub-pixel, and the third side edge is on a side of the fourth side edge facing a sub-pixel row above the sub-pixel row in which the third sub-pixel is located. An extending line of a long axis of each spacer between adjacent sub-pixel rows is parallel to an extending direction of the third side edge, and an extending line of a long axis of each spacer in the sub-pixel rows is perpendicular to the extending direction of the sub-pixel rows.

In one possible implementation, for the spacers in the sub-pixel row, a connecting line of centers of two adjacent spacers passes a center of a sub-pixel between the two adjacent spacers.

In one possible implementation, an extending line of a long axis of the spacer between the second sub-pixel in the one sub-pixel row and the third sub-pixel, adjacent to the second sub-pixel, in the one sub-pixel row coincides with an extending line of a long axis of the first sub-pixel in the other sub-pixel row adjacent to the one sub-pixel row.

In one possible implementation, a distance between two adjacent spacers between adjacent sub-pixel rows is a width of 3 to 8 sub-pixels.

In one possible implementation, the display panel further includes:

at least one circle of through hole retaining wall, wherein the through hole retaining wall and the spacers are on the same side of the base substrate, the through hole retaining wall surrounds the through hole, and the through hole retaining wall includes a first through hole retaining wall at an outermost periphery of the through hole; and at least one circle of frame retaining wall, wherein the frame retaining wall and the through hole retaining wall are on the same side of the base substrate, the frame retaining wall surrounds the display region of the display panel, the through hole retaining wall is in a region encircled by the frame retaining wall, and the frame retaining wall includes a first frame retaining wall closest to the display region. The first display region is between the first through hole retaining wall and the first frame retaining wall.

In one possible implementation, the first through hole retaining wall includes a first side face away from a side of the through hole and a first top face connected with the first side face, and the first frame retaining wall includes a second side face facing the side of the through hole and a second top face connected with the second side face. The display panel further includes an organic encapsulation part between the first frame retaining wall and the first through hole retaining wall, wherein at least one of an orthographic projection of the first side face on the base substrate or an orthographic projection of the second side face on the base substrate overlaps with an orthographic projection of the organic encapsulation part on the base substrate.

In one possible implementation, at least one of an orthographic projection of the first top face on the base substrate or an orthographic projection of the second top face on the base substrate overlaps with the orthographic projection of the organic encapsulation part on the base substrate.

In one possible implementation, the display panel further includes: a first inorganic encapsulation layer on a side of the frame retaining wall away from the base substrate and a second inorganic encapsulation layer on a side of the first inorganic encapsulation layer away from the base substrate, wherein the organic encapsulation part is between the first inorganic encapsulation layer and the second inorganic encapsulation layer. The display panel further includes a pixel defining layer between the base substrate and the first inorganic encapsulation layer, wherein the spacers are on a side of the pixel defining layer away from the base substrate.

In one possible implementation, the spacers make contact with the pixel defining layer and are made of the same material as the pixel defining layer.

In one possible implementation, a planarization layer is further between the base substrate and the pixel defining layer, and the through hole retaining wall is composed of a combination of the planarization layer, the pixel defining layer and the spacers. The through hole retaining wall and the frame retaining wall are on the same layer and are made of the same material.

In one possible implementation, a patterned touch control layer is further on a side of the second inorganic encapsulation layer away from the organic encapsulation part.

An embodiment of the present disclosure further provides a display apparatus, including the display panel provided by the embodiment of the present disclosure.

DETAILED DESCRIPTION OF THE EMBODIMENTS

Figure 1:
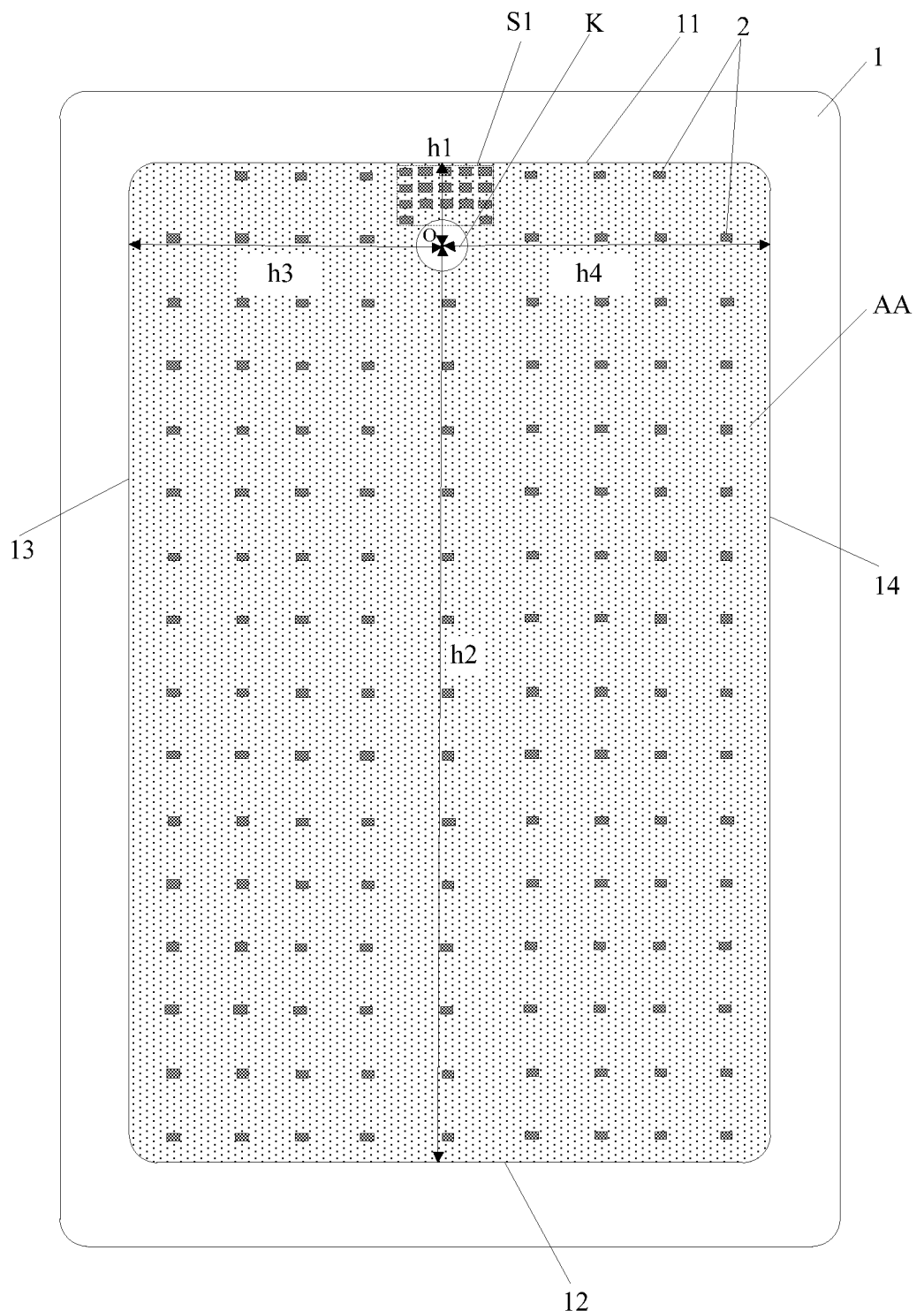
FIG. 1 is a first schematic structural diagram of a display panel provided by an embodiment of the present disclosure.

In order to make objectives, technical solutions and advantages of embodiments of the present disclosure clearer, the technical solutions of the embodiments of the present disclosure will be clearly and completely described below with reference to the accompanying drawings of the embodiments of the present disclosure. Obviously, the described embodiments are a part of embodiments of the present disclosure, rather than all the embodiments. Based on the described embodiments of the present disclosure, all other embodiments obtained by those of ordinary skill in the art without creative efforts fall within the protection scope of the present disclosure.

Unless otherwise defined, technical or scientific terms used in the present disclosure shall have the ordinary meaning as understood by those of ordinary skill in the art to which this present disclosure belongs. "First", "second" and similar words used in the present disclosure do not represent any order, quantity, or importance, but are merely used to distinguish different components. Similar words such as "comprise" or "include" mean that elements or items appearing before the words encompass elements or items recited after the words and their equivalents, but do not exclude other elements or items. Similar words such as "connected" or "linked" are not limited to physical or mechanical connections, but may include electrical connections, whether direct or indirect. "Upper", "lower", "left", "right", etc. are only used to indicate a relative positional relationship, and when an absolute position of a described object changes, the relative positional relationship may also change accordingly.

In order to keep the following description of the embodiments of the present disclosure clear and concise, the present disclosure omits detailed descriptions of well-known functions and well-known components.

An opening of a hole-digging screen has a narrower region from a screen frame. Because the region is narrow, when an organic encapsulation layer is formed by inkjet printing, a flow region of organic encapsulation liquid is correspondingly narrowed, which is prone to causing a condition that the organic encapsulation liquid cannot be leveled or a segment difference is large. If the organic encapsulation liquid is not leveled or the segment difference is large, defects of photoresist coating will be caused during a subsequent touch control forming process, and photoresist flows from a thicker region of the organic encapsulation layer to a thinner region of the organic encapsulation layer, resulting in no photoresist coverage or thin photoresist coverage in a certain region. After developing and etching, a film layer without the photoresist will be completely etched away, resulting in loss of a touch control film layer and function failure.

In view of this, an embodiment of the present disclosure provides a display panel, including: a base substrate 1, a through hole K and a plurality of spacers 2.

The base substrate 1 is provided with a display region AA, wherein the display region AA includes a first display region S1, and the display region AA is provided with a first frame 11 and a second frame 12 opposite to each other, a third frame 13 connecting one end of the first frame 11 and one end of the second frame 12, and a fourth frame 14 connecting the other end of the first frame 11 and the other end of the second frame 12.

The through hole K penetrates through the base substrate 1. A distance between a center O of the through hole K and the first frame 11 is smaller than a distance between the center O of the through hole K and the second frame 12. For example, as shown in FIG. 1, the distance between the center O of the through hole K and the first frame 11 is h1, the distance between the center O of the through hole K and the second frame 12 is h2, and h1 is smaller than h2.

The plurality of spacers 2 is on a side of the base substrate 1. The first display region S1 includes a region between the through hole K and the first frame 11, and a distribution density of the spacers 2 in the first display region S1 is larger than a distribution density of the spacers between the through hole K and the second frame 12.

In the embodiment of the present disclosure, the distribution density of the spacers 2 in the first display region S1 is larger than the distribution density of the spacers between the through hole K and the second frame 12. The distribution density of the spacers 2 in the first display region S1 is increased, so that more spacers 2 participated in drainage, liquidity of subsequently formed organic encapsulation liquid will be increased, which facilitates leveling of the subsequently formed organic encapsulation liquid in the first display region S1 and solves the problems that when the organic encapsulation liquid is not leveled or the segment difference is large and a patterned touch control layer is formed subsequently, defects of photoresist coating will be caused, photoresist flows from a thicker region of the organic encapsulation layer to a thinner region of the organic encapsulation layer, resulting in no photoresist coverage or thin photoresist coverage in a certain region, and after developing and etching, the touch control film layer without the photoresist will be completely etched away, resulting in loss of a touch control film layer and function failure.

In one possible implementation, a shape of the base substrate 1 may be a rectangle, and in a direction parallel to a short edge of the rectangle, the through hole K may be at a middle position. As shown in FIG. 1, a distance h3 between the center O of the through hole K and the third frame 13 is substantially equal to a distance h4 between the center of the through hole K and the fourth frame 14.

Figure 2:
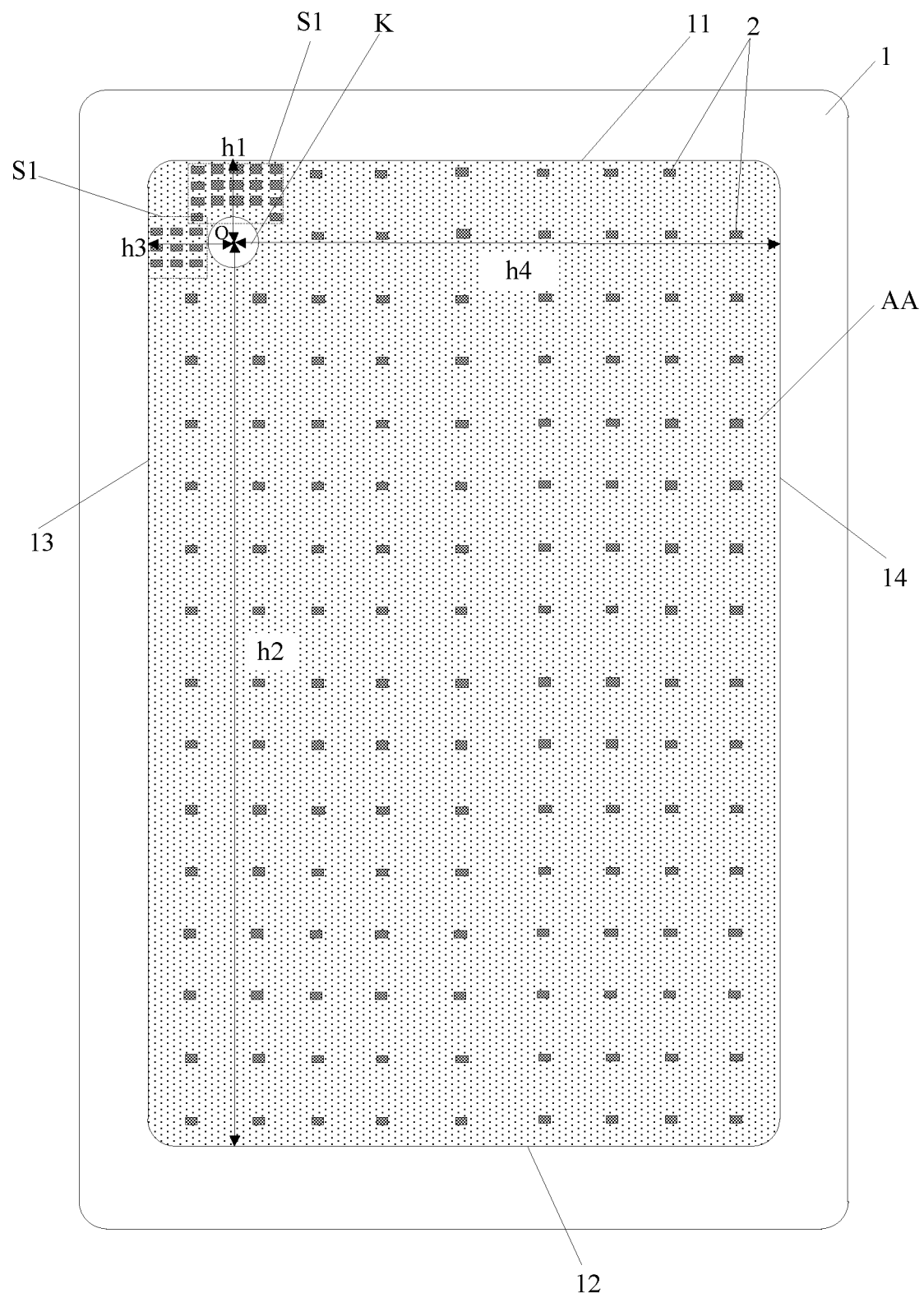
FIG. 2 is a second schematic structural diagram of a display panel provided by an embodiment of the present disclosure.
Figure 3:
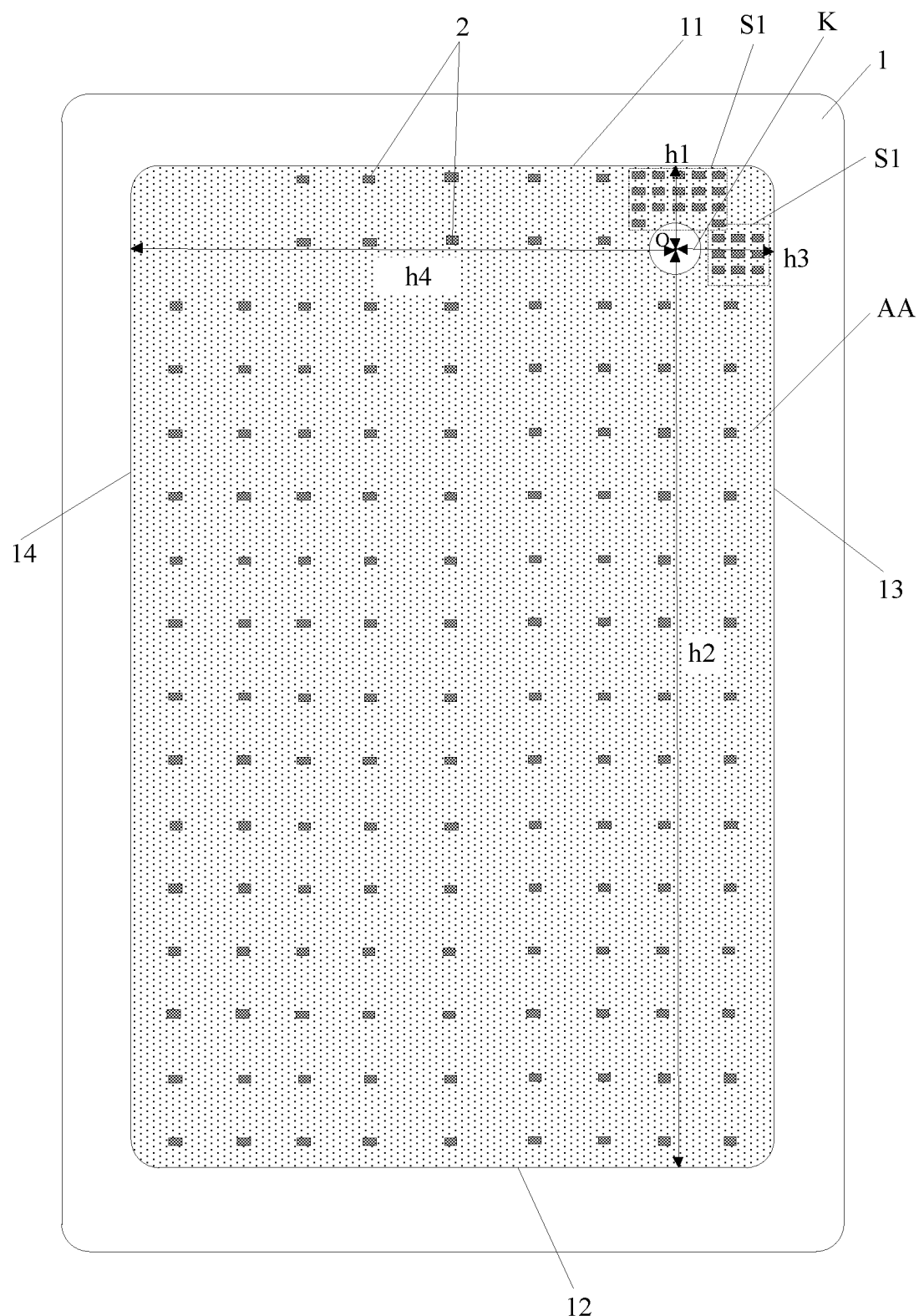
FIG. 3 is a third schematic structural diagram of a display panel provided by an embodiment of the present disclosure.

In one possible implementation, a shape of the base substrate 1 may be the rectangle, and in the direction parallel to a short edge of the rectangle, a distance from the center O of the through hole K to the third frame 13 and a distance from the center O of the through hole K to the fourth frame 14 may also be different. For example, the through hole K may be at a position close to a left side, or at a position close to a right side. In the direction parallel to the short edge of the rectangle, the third frame 13 is a frame with a shorter distance from the center O of the through hole K and the fourth frame 14 is a frame with a longer distance from the center O of the through hole K. For example, as shown in FIG. 2, the through hole K is at the position close to the left side, and a frame on the left side is set as the third frame 13, i.e. the distance h3 between the center O of the through hole K and the third frame 13 is smaller than the distance h4 between the center O of the through hole K and the fourth frame 14; and the first display region S1 further includes the region between the through hole K and the third frame 13, i.e. the region between the through hole K and the third frame 13 is also to be a region with the spacers 2 intensively distributed. For another example, as show in FIG. 3, the through hole K is at the position close to the right side, and a frame on the right side is set as the third frame 13, i.e. the distance h3 between the center O of the through hole K and the third frame 13 is smaller than the distance h4 between the center O of the through hole K and the fourth frame 14; and the first display region S1 further includes the region between the through hole K and the third frame 13, i.e. the region between the through hole K and the third frame 13 is also to be a region with the spacers 2 intensively distributed. In the embodiment of the present disclosure, when the distance between the center O of the through hole K and the third frame 13 is smaller than the distance between the center O of the through hole K and the fourth frame 14, the region between the through hole K and the third frame 13 may also be to be a region with the spacers 2 intensively distributed, and the liquidity of the subsequently formed organic encapsulation liquid in the region between the through hole K and the third frame 13 may also be increased, which facilitates leveling of the subsequently formed organic encapsulation liquid in the region between the through hole K and the third frame 13 and solves the problem that the touch control film layer in the region between the through hole K and the third frame 13 will be completely etched away, resulting in loss of the touch control film layer and function failure.

Figure 4:
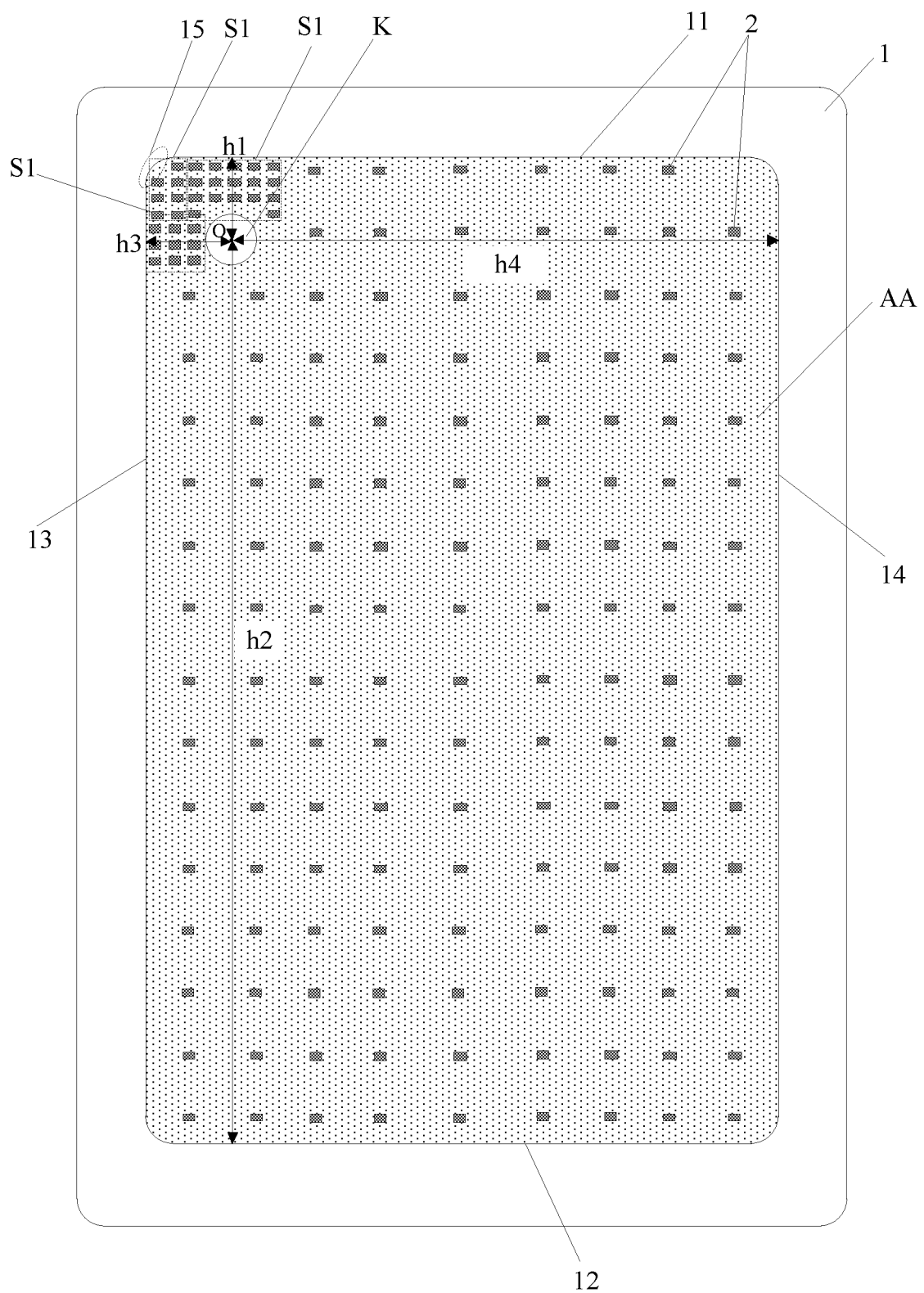
FIG. 4 is a fourth schematic structural diagram of a display panel provided by an embodiment of the present disclosure.
Figure 5:
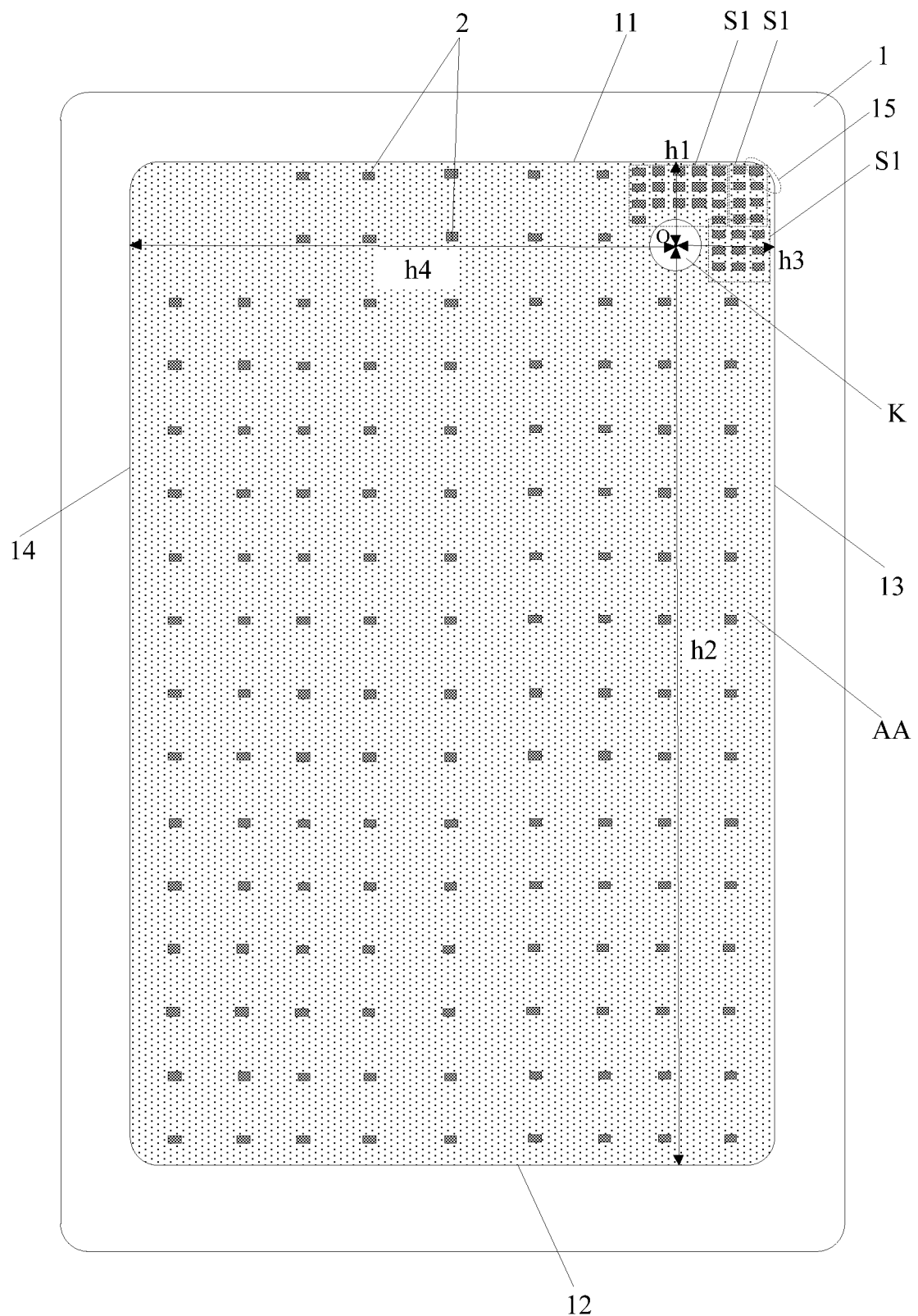
FIG. 5 is a fifth schematic structural diagram of a display panel provided by an embodiment of the present disclosure.

In one possible implementation, when the distance from the center O of the through hole K to the third frame 13 and the distances from the center O of the through hole K to the fourth frame 14 are different, the display region AA further includes a corner part 15. As shown in FIG. 4 and FIG. 5, the first frame 11 is connected with the third frame 13 through the corner part 15, and the first display region S1 further includes a region between the through hole K and the corner part 15. That is, the region between the through hole K and the corner part 15 is also to be a region with the spacers 2 intensively distributed. In the embodiment of the present disclosure, the region between the through hole K and the corner part 15 is also to be the region with the spacers 2 intensively distributed, so the liquidity of the subsequently formed organic encapsulation liquid between the through hole K and the corner part 15 may also be increased, which facilitates leveling of the subsequently formed organic encapsulation liquid in the region between the through hole K and the corner part 15 and solves the problem that the touch control film layer in the region between the through hole K and the corner part 15 will be completely etched away, resulting in loss of the touch control film layer and function failure.

Figure 6:
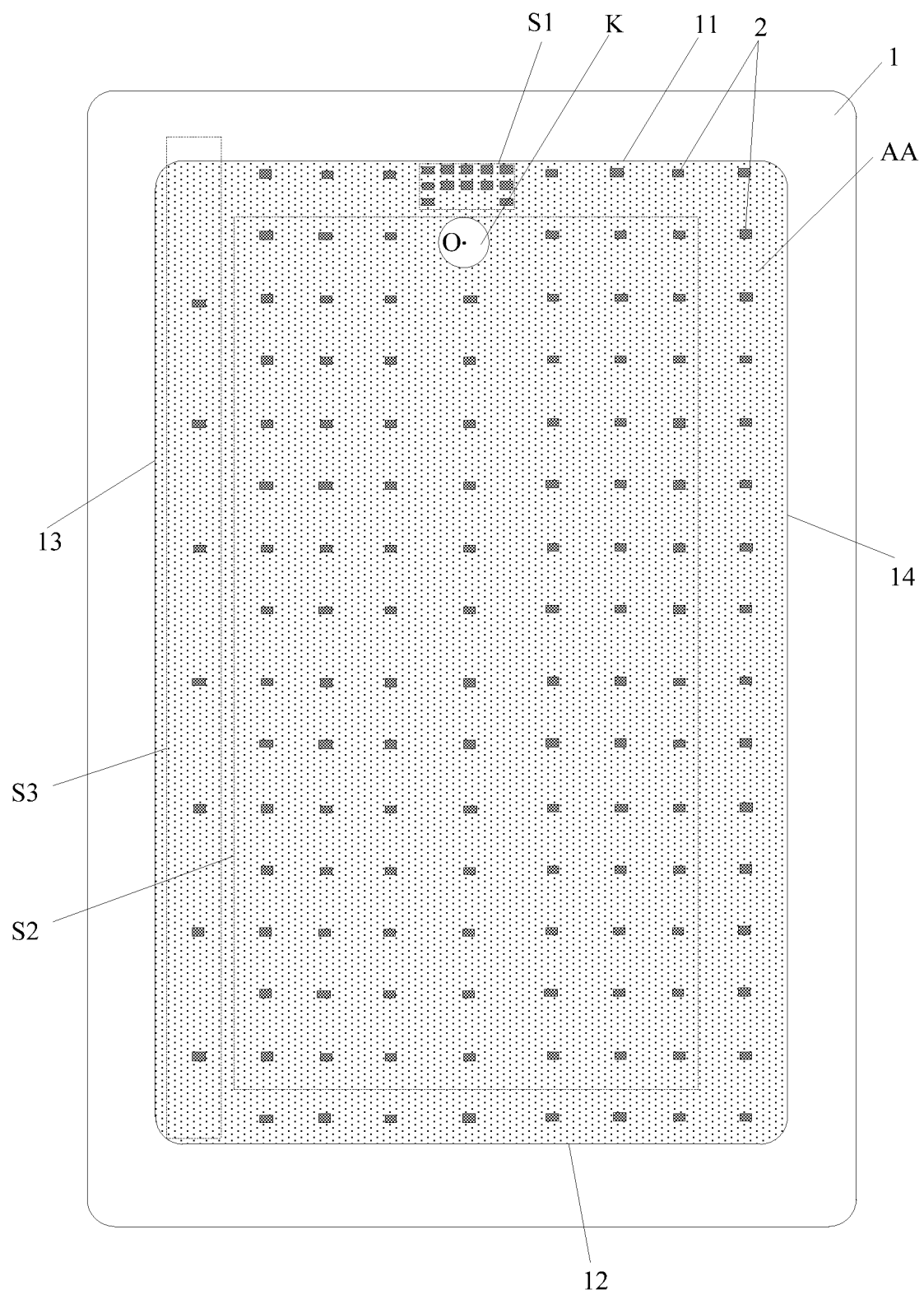
FIG. 6 is a sixth schematic structural diagram of a display panel provided by an embodiment of the present disclosure.
Figure 7:
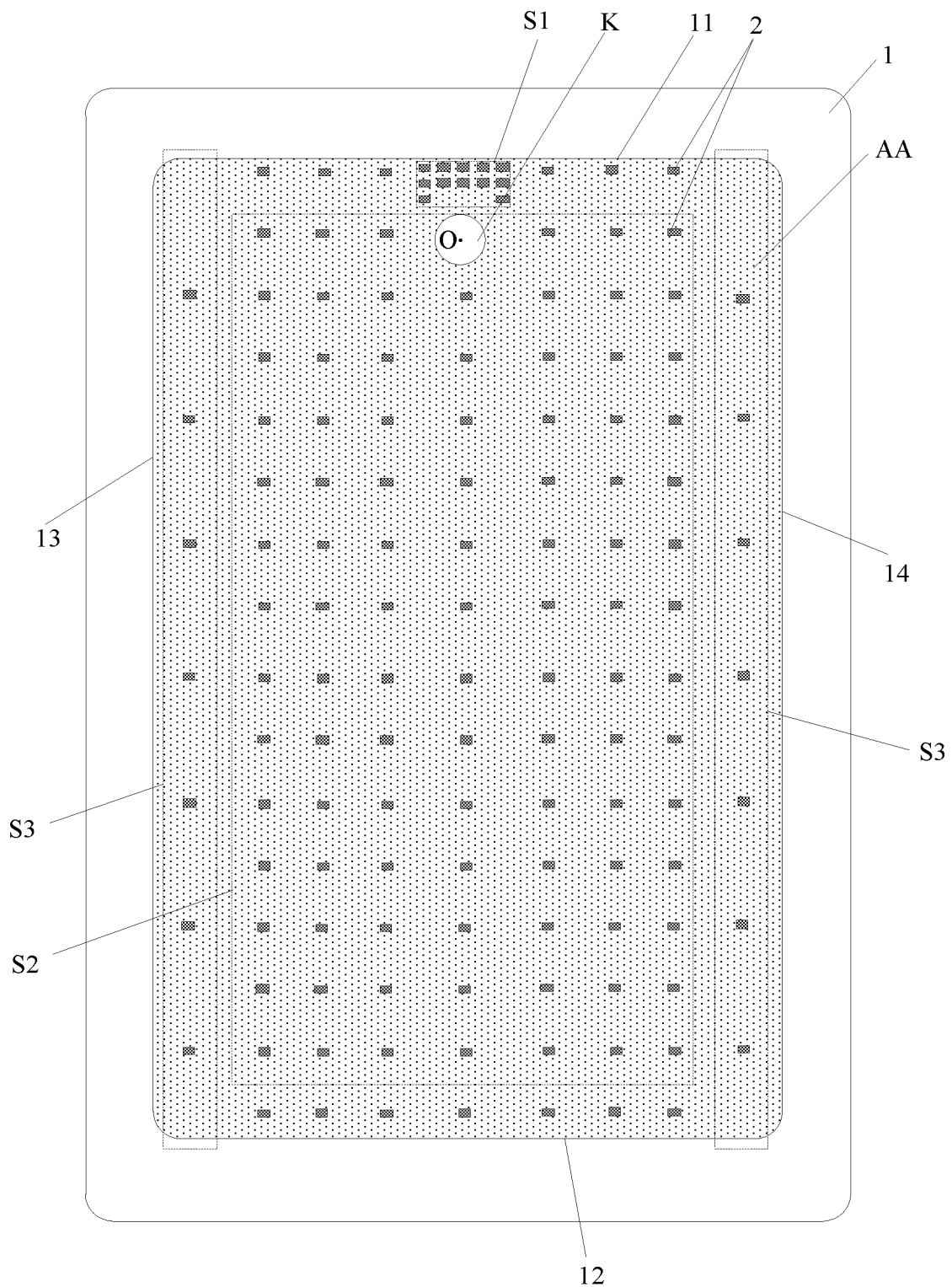
FIG. 7 is a seventh schematic structural diagram of a display panel provided by an embodiment of the present disclosure.
Figure 8:
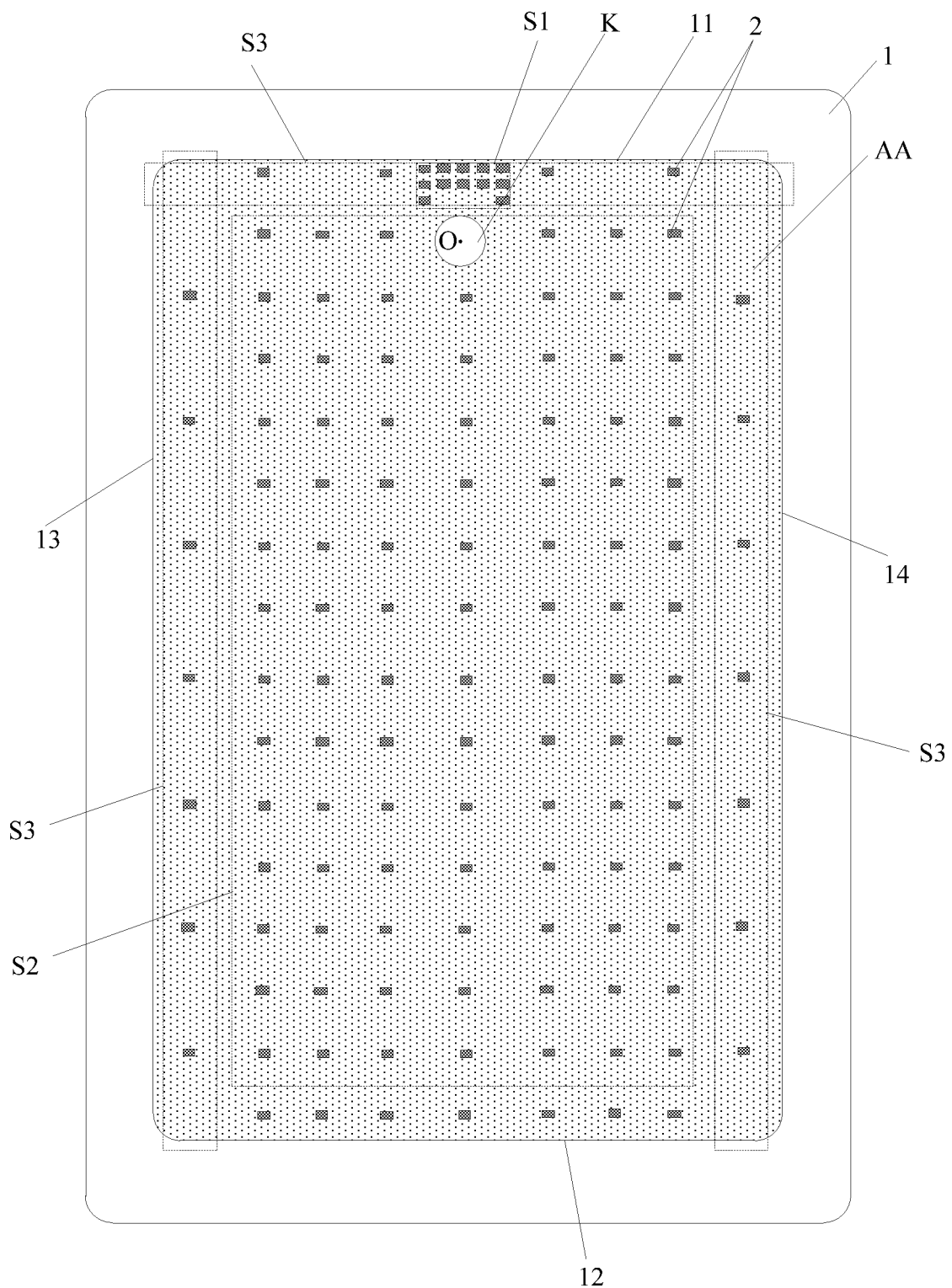
FIG. 8 is an eighth schematic structural diagram of a display panel provided by an embodiment of the present disclosure.
Figure 9:
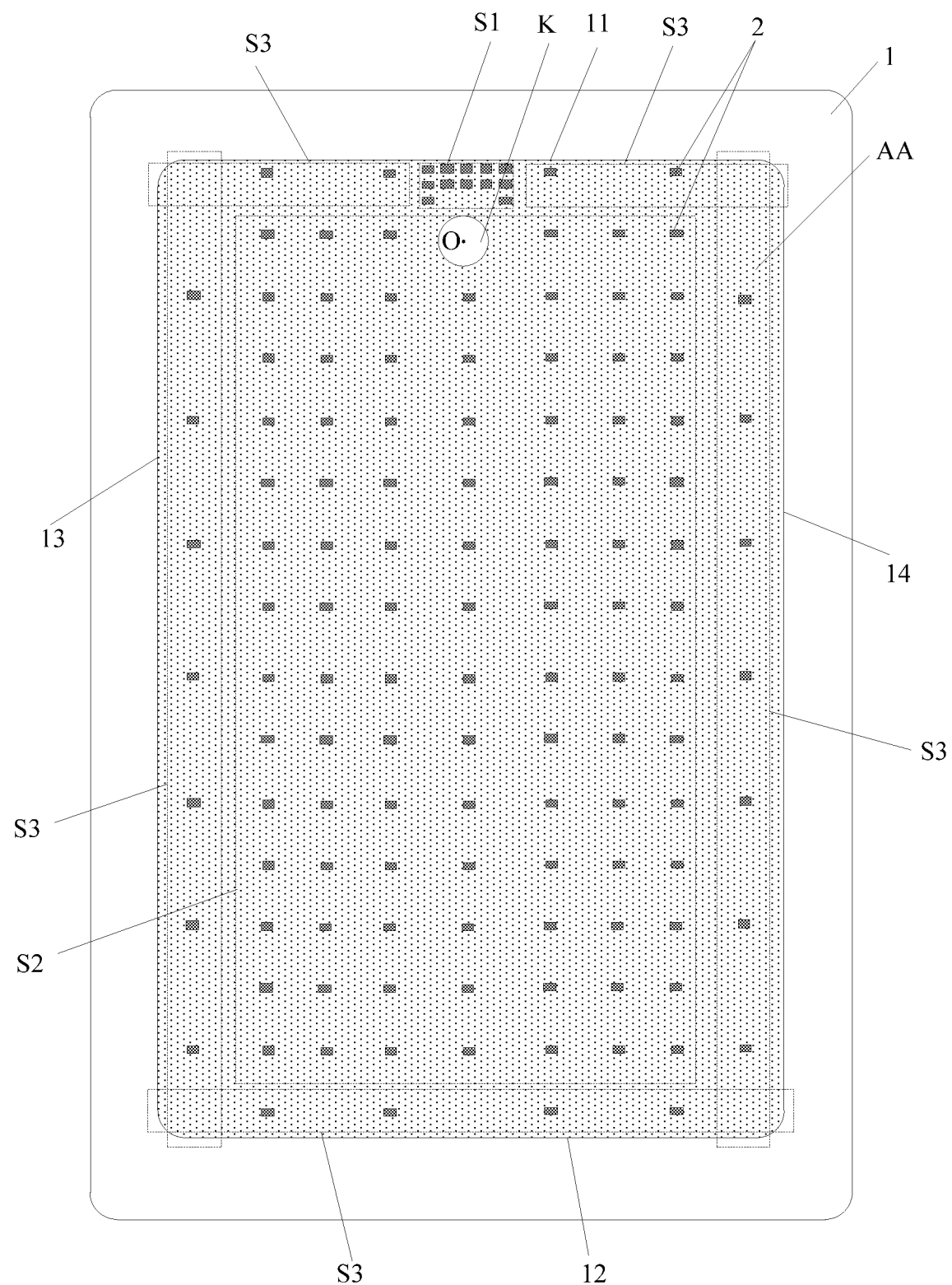
FIG. 9 is a ninth schematic structural diagram of a display panel provided by an embodiment of the present disclosure.

During specific implementation, as shown in FIG. 6, FIG. 7, FIG. 8 and FIG. 9, the display region AA further includes a second display region S2 and a third display region S3, and the third display region S3 is on at least one side of the second display region S2 away from the through hole K. For example, as shown in FIG. 6, the third display region S3 is on a side of the second display region S2 away from the through hole K, and specifically, the third display region S3 is on a left side of the second display region S2. For another example, as shown in FIG. 7, the third display regions S3 are on two sides of the second display region S2 away from the through hole K, and specifically, the third display regions S3 are on the left side and a right side of the second display region S2. For another example, as shown in FIG. 8, the third display regions S3 are on three sides of the second display region S2 away from the through hole K, and specifically, the third display regions S3 are on the left side, the right side and an upper side of the second display region S2. For another example, as shown in FIG. 9, the third display regions S3 are on four sides of the second display region S2 away from the through hole K, and specifically, the third display regions S3 are on the left side, the right side, an upper side and a lower side of the second display region S2. As shown in FIG. 6, FIG. 7, FIG. 8 and FIG. 9, a distribution density of the spacers 2 in the second display region S2 is larger than a distribution density of the spacers 2 in the third display region S3, and the distribution density of the spacers 2 in the first display region S1 is larger than the distribution density of the spacers 2 in the second display region S2. In the embodiment of the present disclosure, because a retaining wall structure blocking the organic encapsulation liquid is usually on a display region on an outer side as well, the distribution density of the spacers 2 in the second display region S2 is larger than the distribution density of the spacers 2 in the third display region S3, and the distribution density of the spacers 2 in the first display region S1 is larger than the distribution density of the spacers 2 in the second display region S2. Therefore, quick leveling of the organic encapsulation liquid between the through hole K and each region with narrower frames (the first display region S1) of the display region can be realized, a leveling speed of the organic encapsulation liquid in an internal display region (the second display region S2) is ranked second, and a flowing speed of the organic encapsulation liquid in a region without a through hole and close to a frame (the third display region S3) is relatively slow, so overflow of the organic encapsulation liquid at positions at the frames is avoided.

It should be noted that, the second display region S2 and the third display region S3 are regions in the display region AA in addition to the first display region S1, i.e. the display region except the first display region S1 is divided into the second display region S2 and the third display region S3.

Figure 10:
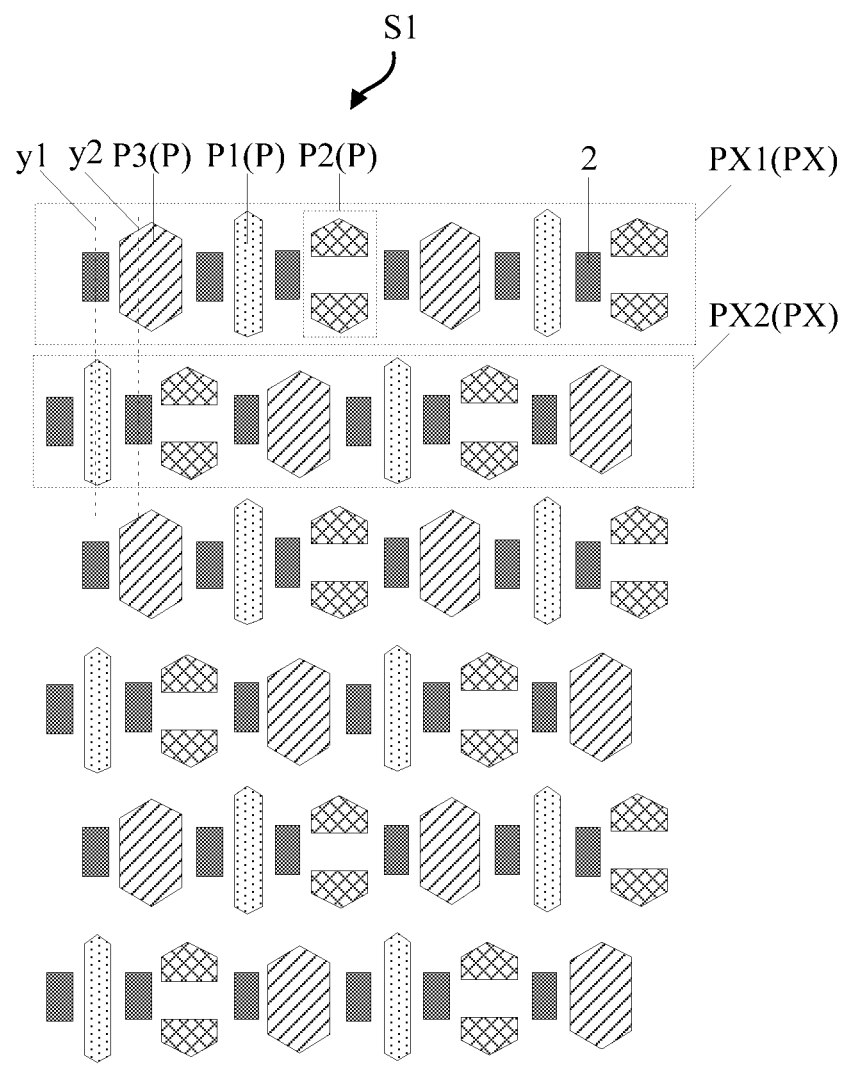
FIG. 10 is a first schematic diagram of spacer distribution in a first display region provided by an embodiment of the present disclosure.

In one possible implementation, as shown in FIG. 10, the display region AA is provided with a plurality of sub-pixels P. In the first display region S1, the spacers 2 are in sub-pixel rows PX and each of the spacers 2 is in a gap between every two adjacent sub-pixels P in each sub-pixel row PX. In the embodiment of the present disclosure, the spacers 2 are in the sub-pixel rows PX and each of the spacers 2 is in the gap between every two adjacent sub-pixels P in each sub-pixel row PX, so the distribution density of the spacers 2 in the first display region S1 is relatively large.

In the first display region S1, the spacers 2 in every two adjacent sub-pixel rows PX are distributed in a misalignment mode. For example, as shown in FIG. 10, in a direction from top to bottom, an extending line y of a long axis of each spacer 2 in the first sub-pixel row PX1 does not coincide with an extending line y2 of a long axis of each spacer 2 in the second sub-pixel row PX2 below. In the first display region S1, the spacers 2 in every two adjacent sub-pixel rows PX are distributed in the misalignment mode, which may increase the liquidity of the organic encapsulation liquid, promote quick flow of the organic encapsulation liquid, and facilitate leveling of the organic encapsulation liquid.

Figure 11:
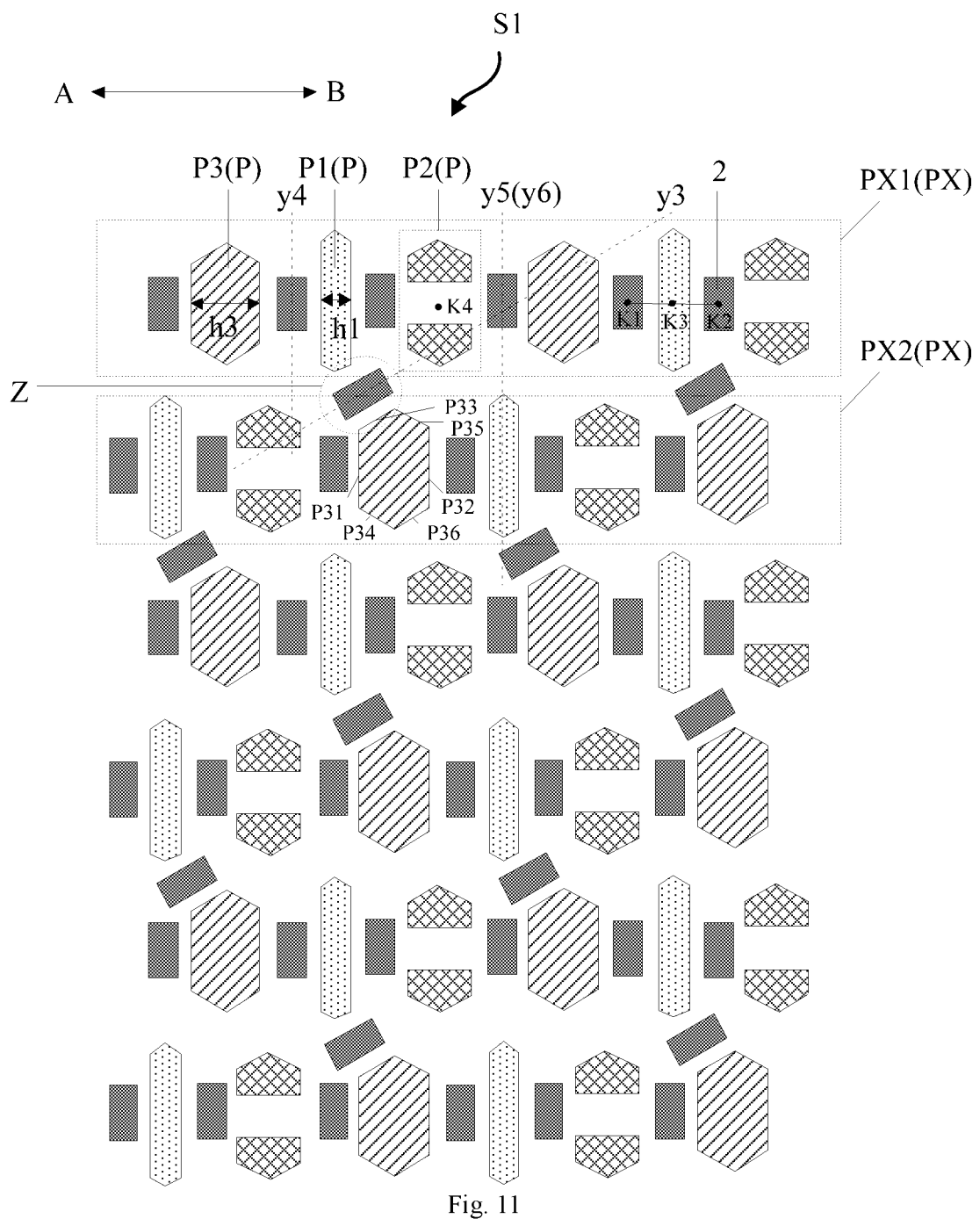
FIG. 11 is a second schematic diagram of spacer distribution in a first display region provided by an embodiment of the present disclosure.

In one possible implementation, as shown in FIG. 11, in the first display region S1, the spacers 2 are also in a gap between every two adjacent sub-pixel rows PX. In the embodiment of the present disclosure, in the first display region S1, the spacers 2 are also in the gap between every two adjacent sub-pixel rows PX, which may further increase the distribution density of the spacers 2 in the first display region S1, thus promoting leveling of the organic encapsulation liquid in the region.

Figure 12:
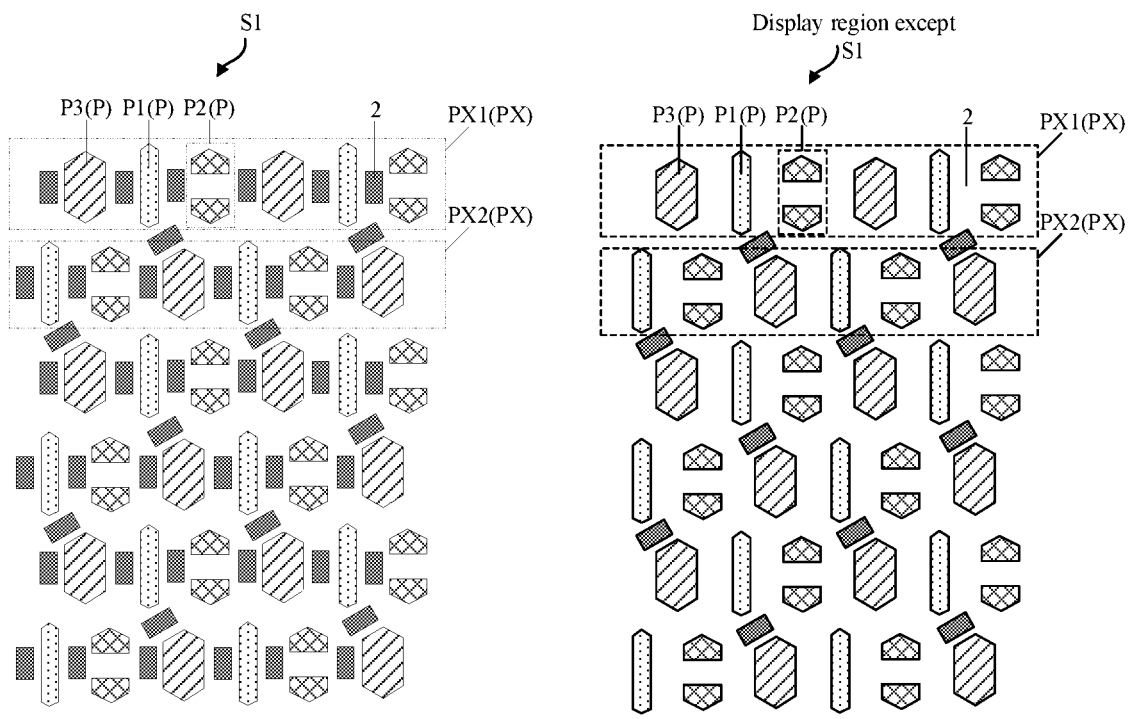
FIG. 12 is a first schematic diagram of spacer distribution in a first display region and a display region except the first display region provided by an embodiment of the present disclosure.

In one possible implementation, as shown in FIG. 12, in the display region except the first display region S1, the spacers 2 are in a gap between every two adjacent sub-pixel rows PX. In the embodiment of the present disclosure, in the first display region S1, the spacers 2 are between every two adjacent sub-pixels P in each sub-pixel row PX, and are in the gaps between adjacent sub-pixel rows PX, and in the display region except the first display region S1, the spacers 2 are in the gap between every two adjacent sub-pixel rows PX, so it can be realized that the distribution density of the spacers 2 in the first display region S1 is larger than the distribution density of the spacers 2 in the display region except the first display region S1.

Figure 13:
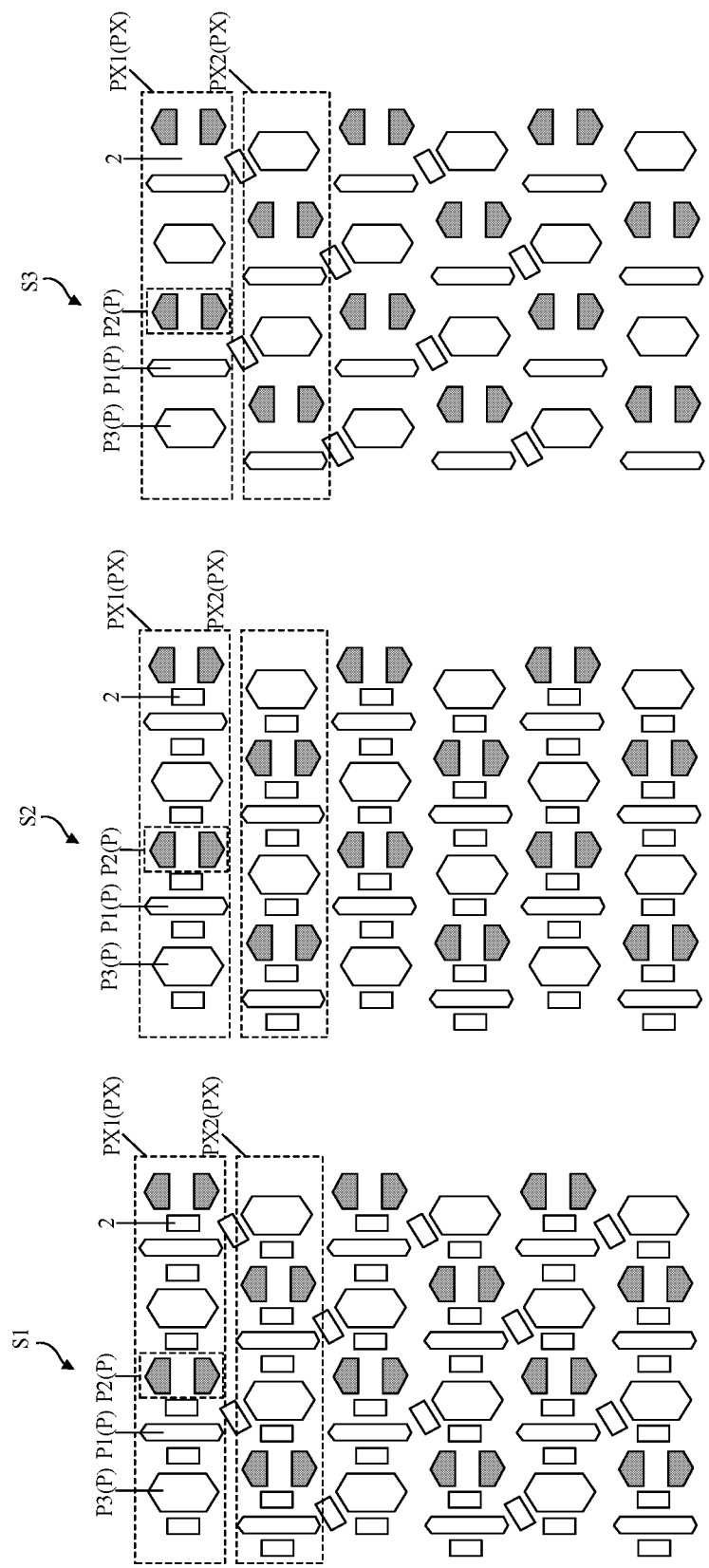
FIG. 13 is a second schematic diagram of spacer distribution in a first display region and a display region except the first display region provided by an embodiment of the present disclosure.

In one possible implementation, as shown in FIG. 13, in the second display region S2, the spacers 2 are in the sub-pixel rows PX, and are in the gap between every two adjacent sub-pixels P; and in the third display region S3, the spacers 2 are in the gap between every two adjacent sub-pixel rows PX. In the embodiment of the present disclosure, in the second display region S2, the spacers 2 are in the sub-pixel rows PX, and are in the gap between every two adjacent sub-pixels P; and in the third display region S3, the spacers 2 are in the gap between every two adjacent sub-pixel rows PX, so it can be realized that the distribution density of the spacers 2 in the first display region S1 is larger than the distribution density of the spacers 2 in the second display region S2 and the distribution density of the spacers 2 in the second display region S2 is larger than the distribution density of the spacers 2 in the third display region S3. Therefore, quick leveling of the organic encapsulation liquid in the first display region S1 can be realized, the leveling speed of the organic encapsulation liquid in the second display region S2 is ranked second, and the flowing speed of the organic encapsulation liquid in the third display region S3 is relatively slow, so overflow of the organic encapsulation liquid at the positions at the frames is avoided.

During specific implementation, as shown in FIG. 11, each sub-pixel row includes a plurality of first sub-pixels P1, second sub-pixels P2 and third sub-pixels P3 arranged sequentially in cycles. The first sub-pixels P1 and the third sub-pixels P3 are hexagonal in shape. A width h1 of each first sub-pixel P1 is smaller than a width h3 of each third sub-pixel P3 in a direction parallel to an extending direction of the sub-pixel row PX (a direction shown by an arrow AB in FIG. 11). Each second sub-pixel P2 includes two pentagonal patterns opposite to each other, and each third sub-pixel P3 in one sub-pixel row PX in two adjacent sub-pixel rows is corresponding to a gap between a corresponding first sub-pixel P1 and a corresponding second sub-pixel P2 of the other sub-pixel row PX in the two adjacent sub-pixel rows. The spacers 2 between the adjacent sub-pixel rows PX are in gaps Z between the first sub-pixels P1 of the other sub-pixel row PX and the third sub-pixels P3 of the one sub-pixel row PX adjacent to the other sub-pixel row PX. In the embodiment of the present disclosure, a relatively large space is provided in the gaps Z between the first sub-pixels P1 of the other sub-pixel row PX and the third sub-pixels P3 of the one sub-pixel row PX adjacent to the other sub-pixel row PX, and the spacers 2 are in the space, so a manufacturing difficulty of the spacers 2 can be reduced.

During specific implementation, as shown in FIG. 11, an extending line y3 of a long axis of each spacer 2 between adjacent sub-pixel rows PX intersects with an extending line y4 of a long axis of each spacer 2 in the sub-pixel rows PX.

During specific implementation, as shown in FIG. 11, a third sub-pixel P3 has a first side edge P31 and a second side edge P32 which are perpendicular to an extending direction of the sub-pixel row PX, a third side edge P33 and a fourth side edge P34 which are respectively connected to two ends of the first side edge P31, and a fifth side edge P35 and a sixth side edge P36 which are respectively connected to two ends of the second side edge P32. The second side edge P32 is on a side of the first side edge P31 away from an second sub-pixel P2 adjacent to the third sub-pixel P3, and the third side edge P33 is on a side of the fourth side edge P34 facing a sub-pixel row PX above the sub-pixel row PX in which the third sub-pixel P3 is located. The extending line y3 of the long axis of each spacer 2 between adjacent sub-pixel rows PX is parallel to an extending direction of the third side edge P33, and the extending line y4 of the long axis of each spacer 2 in the sub-pixel rows PX is perpendicular to the extending direction of the sub-pixel row PX. In the embodiment of the present disclosure, the extending line y3 of the long axis of each spacer 2 between adjacent sub-pixel rows PX is parallel to the extending direction of the third side edge P33. Therefore, a relatively large arrangement space is provided for the spacers 2 between adjacent sub-pixel rows PX, so that when the spacers 2 are between adjacent sub-pixel rows PX, a relatively high manufacturing success rate of the spacers 2 is realized. The extending line y4 of the long axis of each spacer 2 in the sub-pixel rows PX is perpendicular to the extending direction of the sub-pixel row PX, arrangement of the spacers 2 at different positions can be facilitated, and therefore, a relatively large arrangement space is provided for the spacers 2 in the sub-pixel rows PX, so that when the spacers 2 are in the sub-pixel rows PX, a relatively high manufacturing success rate of the spacers 2 is realized.

During specific implementation, as shown in FIG. 11, for the spacers 2 in the sub-pixel rows PX, a connecting line K1K2 of centers of two adjacent spacers 2 passes a center K3 of a sub-pixel between the two adjacent spacers 2. A center K4 of the second sub-pixel P2 may be considered to be a center of an overall image constituted by the two pentagonal patterns.

During specific implementation, as shown in FIG. 11, an extending line y5 of a long axis of a spacer 2 between a second sub-pixel P2 in the first sub-pixel row and a third sub-pixel P3 in the first sub-pixel row adjacent to the second sub-pixel P2 coincides with an extending line y6 of a long axis of the corresponding first sub-pixel P1 in the second sub-pixel row PX adjacent to the first sub-pixel row.

During specific implementation, as shown in FIG. 11, a distance between two adjacent spacers 2 between adjacent sub-pixel rows PX is a width of 3 to 8 sub-pixels. A width of a single sub-pixel may be 10 microns to 40 microns.

Figure 14:
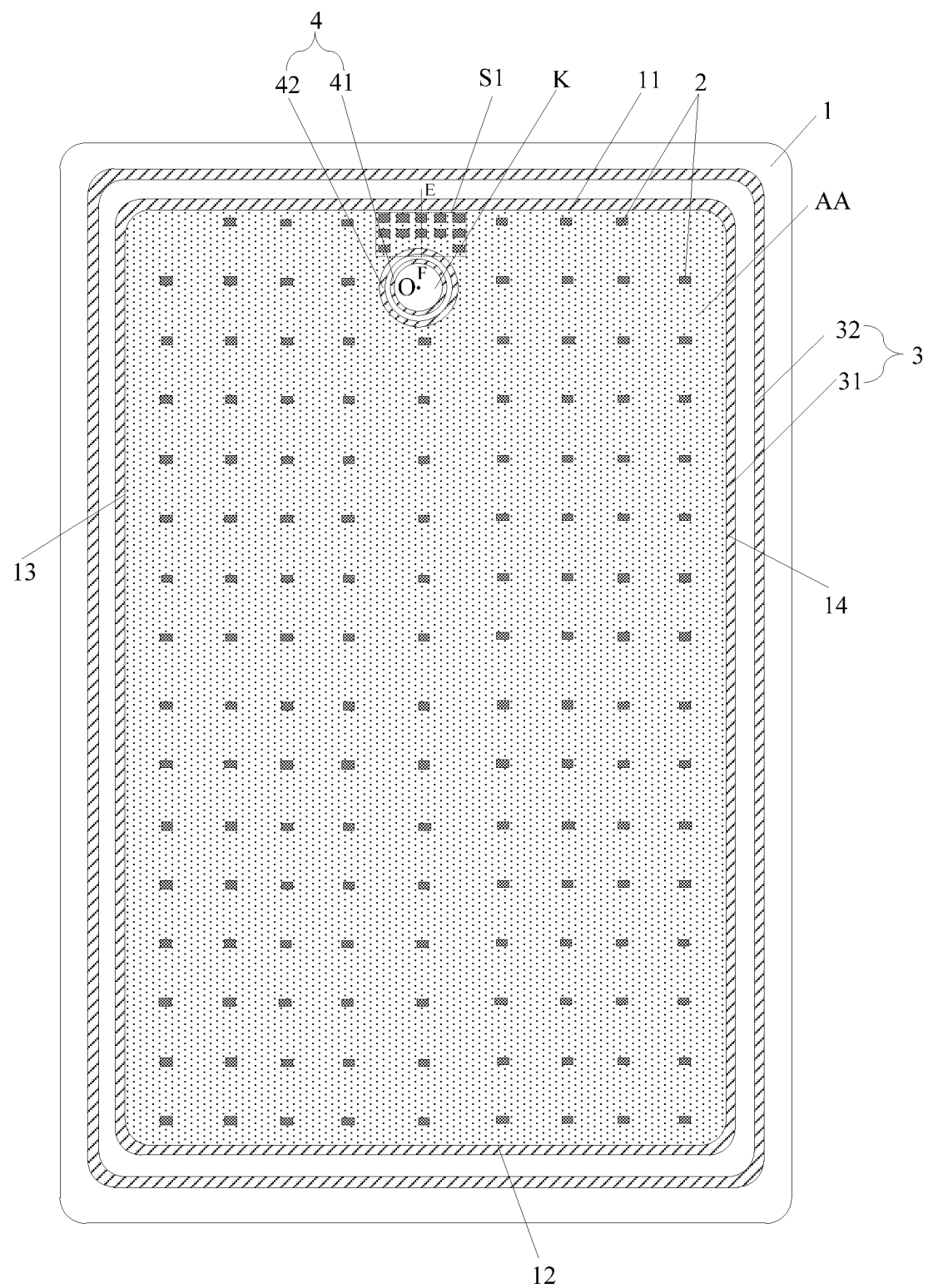
FIG. 14 is a tenth schematic structural diagram of a display panel provided by an embodiment of the present disclosure.
Figure 15A:
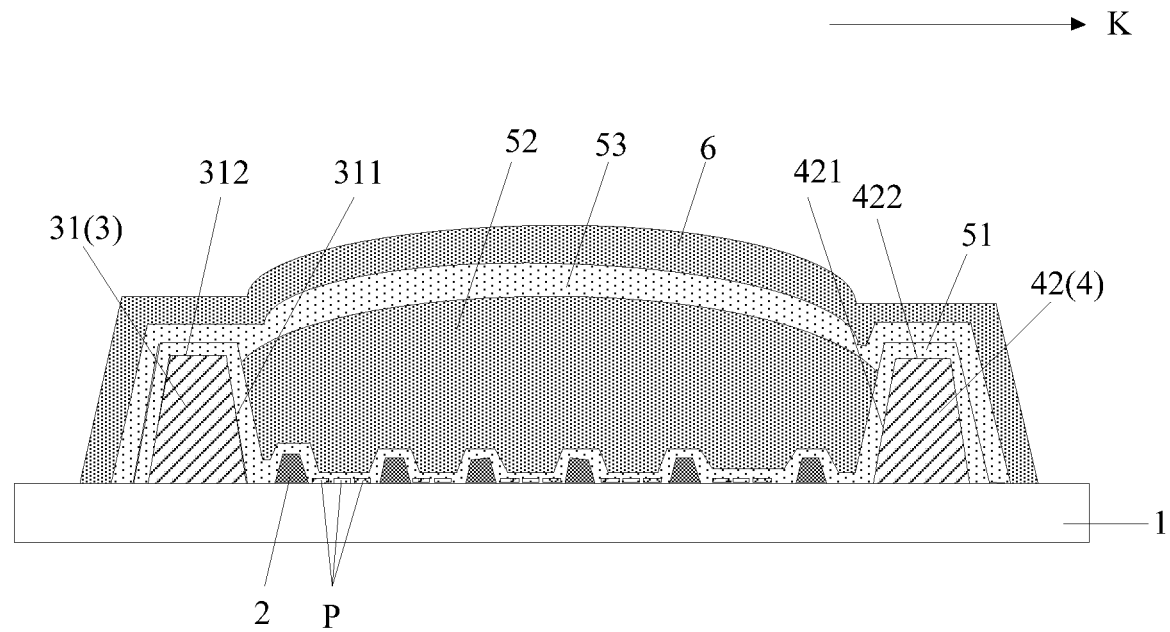
FIG. 15A is an enlarged schematic sectional view of a dotted line EF in FIG. 14.
Figure 16:
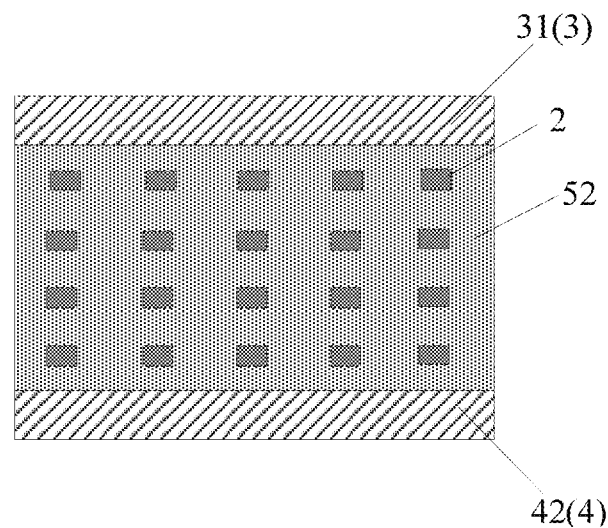
FIG. 16 is an enlarged schematic diagram of FIG. 14 in a first display region.

In one possible implementation, as shown in FIG. 14, FIG. 15A and FIG. 16, wherein FIG. 15A is a schematic sectional view of FIG. 14 along a dotted line EF and FIG. 16 is a locally enlarged schematic diagram of FIG. 14 in the first display region S1. The display panel further includes: at least one circle of through hole retaining wall 4 and at least one circle of frame retaining wall 3. The through hole retaining wall 4 and the spacers 2 are on the same side of the base substrate 1, the through hole retaining wall 4 surrounds the through hole K, and the through hole retaining wall 4 includes a first through hole retaining wall 42 at an outermost periphery of the through hole K. The through hole retaining wall 4 further includes a second through hole retaining wall 41 within the first through hole retaining wall. The frame retaining wall 3 and the through hole retaining wall 4 are on the same side of the base substrate 1, the frame retaining wall 3 surrounds the display region AA of the display panel, the through hole retaining wall 4 is in a region encircled by the frame retaining wall 3, and the frame retaining wall 3 includes a first frame retaining wall 31 closest to the display region AA. The first display region S1 is between the first through hole retaining wall 42 and the first frame retaining wall 31. The frame retaining wall 3 further includes a second frame retaining wall 32 surrounding the first frame retaining wall 31.

In one possible implementation, as shown in FIG. 15A, the first through hole retaining wall 42 includes a first side face 421 away from a side of the through hole K and a first top face 422 connected with the first side face 421, and the first frame retaining wall 31 includes a second side face 311 facing the side of the through hole and a second top face 312 connected with the second side face 311.

Figure 15B:
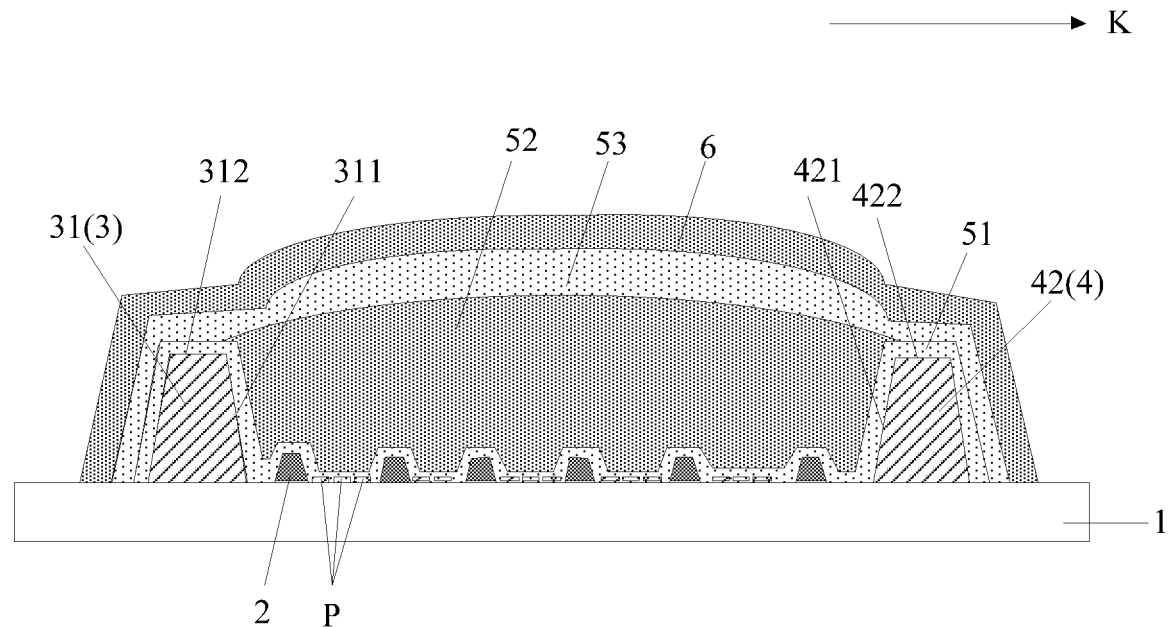
FIG. 15B is another enlarged schematic sectional view of a dotted line EF in FIG. 14.

The display panel further includes an organic encapsulation part 52 between the first frame retaining wall 31 and the first through hole retaining wall 42. At least one of an orthographic projection of the first side face 421 on the base substrate 1 and an orthographic projection of the second side face 311 on the base substrate 1 overlaps with an orthographic projection of the organic encapsulation part 52 on the base substrate 1. In the embodiment of the present disclosure, through the arrangement of the spacers 2 with a high distribution density in the first display region S1, the organic encapsulation part 52 in the first display region S1 is relatively flat, and at least one of the orthographic projection of the first side face 421 on the base substrate 1 or the orthographic projection of the second side face 311 on the base substrate 1 overlaps with the orthographic projection of the organic encapsulation part 52 on the base substrate 1, so it is avoided that if the organic encapsulation part 52 is not leveled, a gap exists between the organic encapsulation part 52 and the first frame retaining wall 31 as well as between the organic encapsulation part 52 and the first through hole retaining wall 42, and relatively large film layer segment difference exits at the gaps, which is not conducive to pattern manufacturing of a touch control layer. Of course, in a practical manufacturing process, in a process of manufacturing the organic encapsulation part 52, partial overflow of an organic encapsulation material may also be caused. That is, in one possible implementation, as shown in FIG. 15B, at least one of an orthographic projection of the first top face 422 on the base substrate 1 and an orthographic projection of the second top face 312 on the base substrate 1 overlaps with the orthographic projection of the organic encapsulation part 52 on the base substrate 1. The orthographic projection of the organic encapsulation part 52 on the base substrate 1 may partially or fully overlap with the orthographic projection of the first top face on the base substrate 1, or the orthographic projection of the organic encapsulation part 52 on the base substrate 1 may partially or fully overlap with the orthographic projection of the second top face on the base substrate 1.

During specific implementation, the quantity of the through hole retaining walls 4 and frame retaining walls 3 covered by the organic encapsulation part 52 may depend on the density of the spacers 2 and heights of the through hole retaining walls 4 and frame retaining walls 3. As shown in a preferred embodiment, FIG. 14 and FIG. 15A, two circles of through hole retaining walls 4 may be included, two circles of frame retaining walls 3 may be included, the organic encapsulation part 52 may cover a part or all of tops of one circle of a through hole retaining wall 4 and one circle of a frame retaining wall 3 close to the organic encapsulation part 52, so as to ensure leveling. That is, the organic encapsulation part 52 may cover a part or all of a top of the first frame retaining wall 31, and the organic encapsulation part 52 may cover a part or all of a top of the first through hole retaining wall 42.

In one possible implementation, the heights of the frame retaining walls 3 may be equal. The heights of the frame retaining walls 3 may be 6 microns to 20 microns.

In one possible implementation, as shown in FIG. 15A, the display panel further includes a first inorganic encapsulation layer 51 on a side of the frame retaining wall 3 away from the base substrate 1 and a second inorganic encapsulation layer 53 on a side of the first inorganic encapsulation layer 51 away from the base substrate 1, wherein the organic encapsulation part 52 is between the first inorganic encapsulation layer 51 and the second inorganic encapsulation layer 53. The display panel further includes a pixel defining layer (not shown in the drawing) between the base substrate 1 and the first inorganic encapsulation layer 51, wherein the spacers 2 are on a side of the pixel defining layer away from the base substrate 1.

In one possible implementation, the spacers 2 are in contact with the pixel defining layer and are made of the same material as the pixel defining layer.

Figure 17:
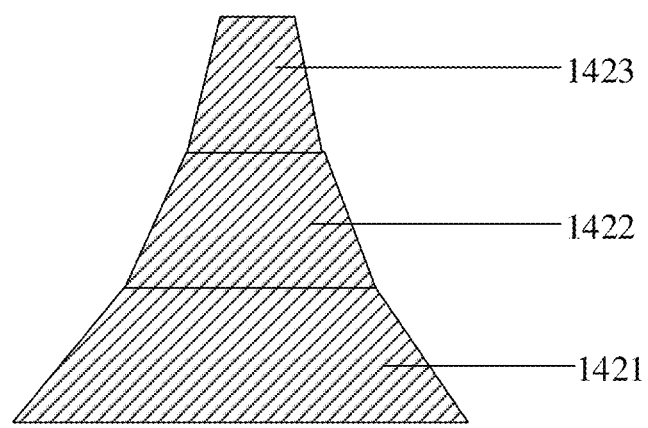
FIG. 17 is a schematic diagram of constitution of a through hole retaining wall provided by an embodiment of the present disclosure.

In one possible implementation, as shown in FIG. 17, a planarization layer 1421 is between the base substrate 1 and the pixel defining layer, and the through hole retaining wall 4 is composed of a combination of the planarization layer 1421, the pixel defining layer 1422 and the spacers 1423 (i.e., the aforementioned spacers 2). The through hole retaining wall 4 and the frame retaining wall 3 are on the same layer and are made of the same material.

In one possible implementation, as shown in FIG. 15A, a patterned touch control layer 6 is on a side of the second inorganic encapsulation layer 53 away from the organic encapsulation part 52.

An embodiment of the present disclosure further provides a display apparatus, including the display panel provided by the embodiment of the present disclosure.

In the embodiment of the present disclosure, the distribution density of the spacers 2 in the first display region S1 is larger than the distribution density of the spacers between the through hole K and the second frame 12. The distribution density of the spacers 2 is increased, so that more spacers 2 participated in drainage, liquidity of subsequently formed organic encapsulation liquid will be increased, which facilitates leveling of the subsequently formed organic encapsulation liquid in the first display region S1 and solves the problems that if the organic encapsulation liquid is not leveled or the segment difference is large, defects of photoresist coating will be caused when a patterned touch control layer is formed subsequently, photoresist flows from a thicker region of the organic encapsulation layer to a thinner region of the organic encapsulation layer, resulting in no photoresist coverage or thin photoresist coverage in a certain region, and after developing and etching, the touch control film layer without the photoresist will be completely etched away, resulting in loss of a touch control film layer and function failure.

While preferred embodiments of the present invention have been described, additional changes and modifications to these embodiments may be made by those of skill in the art once they are aware of basic inventive concepts. Therefore, the appended claims are intended to be construed to include the preferred embodiments and all changes and modifications that fall within the scope of the present invention.

Obviously, those of skill in the art can make various changes and modifications to the embodiments of the present invention without departing from the spirit and scope of the embodiments of the present invention. Thus, provided that these changes and modifications of the embodiments of the present invention fall within the scope of the claims of the present invention and their equivalents, the present invention is also intended to cover such changes and modifications.

What is claimed is:

1. A display panel, comprising:
   a base substrate, provided with a display region, wherein the display region is provided with a first display region, and the display region is provided with a first frame and a second frame opposite to each other, a third frame connecting one end of the first frame and one end of the second frame, and a fourth frame connecting the other end of the first frame and the other end of the second frame;
   a through hole, penetrating through the base substrate, wherein a distance between a center of the through hole and the first frame is smaller than a distance between the center of the through hole and the second frame; and a plurality of spacers, on a side of the base substrate, wherein the first display region comprises a region between the through hole and the first frame, and a distribution density of spacers in the first display region is larger than a distribution density of spacers between the through hole and the second frame;

wherein the display region further comprises a second display region and a third display region, and the third display region is on at least one side of the second display region away from the through hole; and a distribution density of spacers in the second display region is larger than a distribution density of spacers in the third display region, and the distribution density of the spacers in the first display region is larger than the distribution density of the spacers in the second display region;

wherein the display region has a plurality of sub-pixels, and in the first display region, spacers are in sub-pixel rows and are in a gap between every two adjacent sub-pixels in each of the sub-pixel rows;

in the first display region, spacers are further in a gap between every two adjacent sub-pixel rows; and in the second display region, spacers are in the sub-pixel rows and are in a gap between every two adjacent sub-pixels, and in the third display region, the spacers are in a gap between every two adjacent sub-pixel rows.

2. The display panel according to claim 1, wherein a distance between the center of the through hole and the third frame is substantially equal to a distance between the center of the through hole and the fourth frame.

3. The display panel according to claim 1, wherein a distance between the center of the through hole and the third frame is smaller than a distance between the center of the through hole and the fourth frame, and the first display region further comprises a region between the through hole and the third frame.

4. The display panel according to claim 3, wherein the display region further comprises a corner part, the first frame is connected with the third frame through the corner part, and the first display region further comprises a region between the through hole and the corner part.

5. The display panel according to claim 1, wherein in the first display region, the spacers in every two adjacent sub-pixel rows are distributed in a misalignment mode.

6. The display panel according to claim 1, wherein each of the sub-pixel rows comprises:

a plurality of sub-pixels; wherein the sub-pixels of the sub-pixel row comprise a first sub-pixel, a second sub-pixel and a third sub-pixel arranged sequentially in cycles;

wherein the first sub-pixels and the third sub-pixels are hexagonal in shape, a width of the first sub-pixel is smaller than a width of the third sub-pixel in a direction parallel to an extending direction of the sub-pixel row, the second sub-pixel comprises two pentagonal patterns opposite to each other, and a third sub-pixel of one sub-pixel row in two adjacent sub-pixel rows is corresponding to a gap between a first sub-pixel and a second sub-pixel of another sub-pixel row in the two adjacent sub-pixel rows; and the spacers between the two adjacent sub-pixel rows are in gaps between the first sub-pixels of the another sub-pixel row and the third sub-pixels of the one sub-pixel row.

7. The display panel according to claim 6, wherein the third sub-pixel is provided with a first side edge and a second side edge which are perpendicular to the extending direction of the sub-pixel row, a third side edge and a fourth side edge which are respectively connected to two ends of the first side edge, and a fifth side edge and a sixth side edge which are respectively connected to two ends of the second side edge; wherein the second side edge is on a side of the first side edge away from the second sub-pixel adjacent to the third sub-pixel, and the third side edge is on a side of the fourth side edge facing a sub-pixel row above the sub-pixel row in which the third sub-pixel is located; and an extending line of a long axis of each spacer between adjacent sub-pixel rows is parallel to an extending direction of the third side edge, and an extending line of a long axis of each spacer in the sub-pixel rows is perpendicular to the extending direction of the sub-pixel row.

8. The display panel according to claim 6, wherein for the spacers in the sub-pixel row, a connecting line of centers of two adjacent spacers passes a center of a sub-pixel between the two adjacent spacers.

9. The display panel according to claim 6, wherein an extending line of a long axis of the spacer between the second sub-pixel in the one sub-pixel row and the third sub-pixel, adjacent to the second sub-pixel, in the one sub-pixel row coincides with an extending line of a long axis of the first sub-pixel in the another sub-pixel row adjacent to the one sub-pixel row.

10. The display panel according to claim 6, wherein a distance between two adjacent spacers between adjacent sub-pixel rows is a width of 3 to 8 sub-pixels.

11. The display panel according to claim 1, wherein, in the first display region, an extending line of a long axis of each spacer between adjacent sub-pixel rows intersects with an extending line of a long axis of each spacer in the sub-pixel rows.

12. The display panel according to claim 1, further comprising:

at least one through hole retaining wall surrounding the through hole, wherein the through hole retaining wall and the spacers are on a same side of the base substrate, and the through hole retaining wall comprises a first through hole retaining wall at an outermost periphery of the through hole;

at least one frame retaining wall surrounding the display region of the display panel, wherein the frame retaining wall and the through hole retaining wall are on a same side of the base substrate, the through hole retaining wall is in a region encircled by the frame retaining wall, and the frame retaining wall comprises a first frame retaining wall closest to the display region; and the first display region is between the first through hole retaining wall and the first frame retaining wall.

13. The display panel according to claim 12, wherein the first through hole retaining wall comprises a first side face away from a side of the through hole and a first top face connected with the first side face, and the first frame retaining wall comprises a second side face facing the side of the through hole and a second top face connected with the second side face; and the display panel further comprises an organic encapsulation part between the first frame retaining wall and the first through hole retaining wall, wherein at least one of an orthographic projection of the first side face on the base substrate or an orthographic projection of the second side face on the base substrate overlaps with an orthographic projection of the organic encapsulation part on the base substrate.

14. The display panel according to claim 13, wherein at least one of an orthographic projection of the first top face on the base substrate or an orthographic projection of the second top face on the base substrate overlaps with the orthographic projection of the organic encapsulation part on the base substrate.

15. The display panel according to claim 13, further comprising a first inorganic encapsulation layer on a side of the frame retaining wall away from the base substrate and a second inorganic encapsulation layer on a side of the first inorganic encapsulation layer away from the base substrate, wherein the organic encapsulation part is between the first inorganic encapsulation layer and the second inorganic encapsulation layer; and the display panel further comprises a pixel defining layer between the base substrate and the first inorganic encapsulation layer, wherein the spacers are on a side of the pixel defining layer away from the base substrate.

16. The display panel according to claim 15, wherein the spacers are in contact with the pixel defining layer and are made of a same material as the pixel defining layer.

17. The display panel according to claim 15, wherein a planarization layer is between the base substrate and the pixel defining layer, and the through hole retaining wall is composed of a combination of the planarization layer, the pixel defining layer and the spacers; and the through hole retaining wall and the frame retaining wall are on a same layer and are made of a same material.

18. The display panel according to claim 15, wherein a patterned touch control layer is on a side of the second inorganic encapsulation layer away from the organic encapsulation part.

19. A display apparatus, comprising the display panel according to claim 1.

* * * * *